United States Patent [19]

Hong

[11] Patent Number: 5,596,230

[45] Date of Patent: Jan. 21, 1997

[54] INTERCONNECTION WITH SELF-ALIGNED VIA PLUG

[75] Inventor: Gary Hong, Hsinchu, Taiwan

[73] Assignee: United Microelectronics Corporation, Hsin-chu, Taiwan

[21] Appl. No.: 583,197

[22] Filed: Jan. 4, 1996

Related U.S. Application Data

[63] Continuation of Ser. No. 351,491, Dec. 7, 1994, abandoned, Division of Ser. No. 158,385, Nov. 29, 1993, Pat. No. 5,382,545.

[51] Int. Cl.$^6$ .................. H01L 23/485; H01L 23/532
[52] U.S. Cl. .................. 257/758; 257/773; 257/776; 257/752
[58] Field of Search .................. 257/758, 773, 257/774, 776, 750, 752, 759, 760

[56] References Cited

U.S. PATENT DOCUMENTS

| | | | |
|---|---|---|---|
| 5,117,276 | 5/1992 | Thomas et al. | 257/758 |
| 5,155,576 | 10/1992 | Mizushima | 257/759 |
| 5,189,506 | 2/1993 | Cronin et al. | 257/758 |
| 5,396,092 | 3/1995 | Peek | 257/758 |
| 5,442,236 | 8/1995 | Fukazawa | 257/759 |

OTHER PUBLICATIONS

K. Ueno et al, "Quarter–Micron Planarized Interconnection Technology with Self–Aligned Plug", IEDM '92, 305–307.

Primary Examiner—Sara W. Crane
Assistant Examiner—David B. Hardy
Attorney, Agent, or Firm—William H. Wright

[57] ABSTRACT

A device and a method of formation on a substrate of a semiconductor interconnection via structure for semiconductor devices is provided. Initially, form a first metal layer on the substrate, a first dielectric layer upon the first metal layer, and a mask upon the dielectric layer with a metal etching pattern therein. Then, etch through the first dielectric layer and the first metal layer to the substrate forming trenches between metal lines formed from the first metal layer covered with the dielectric layer. Next, form a first etch stop layer upon the surface of the the first dielectric layer and planarize it, a second dielectric layer above the etch stop layer, and a second etch stop layer on the second dielectric layer. Then, pattern the second dielectric and the second etch stop layer and etch to form a via hole down to a surface of the first metal layer. Then, form a second metal layer and a metal plug in the via hole extending into contact with the first metal layer.

6 Claims, 6 Drawing Sheets

5,596,230

INTERCONNECTION WITH SELF-ALIGNED VIA PLUG

This application is a continuation of application Ser. No. 08/351,491 filed on Dec. 7, 1994 now abandoned; which is a division of application Ser. No. 08/158,385, filed Nov. 29, 1993, now U.S. Pat. No. 5,382,545 issued Jan. 17, 1995.

BACKGROUND OF THE INVENTION

1. Field of the Invention

This invention relates to planarized interconnection technology for semiconductor devices and more particularly to self-alignment processes for the manufacture thereof.

2. Description of Related Art

K. Ueno et al, "Quarter-Micron Planarized Interconnection Technology with Self-Aligned Plug", IEDM 92-305-307 shows metal alignment at the top of a structure in the top layer of metallization. But there remains a problem of alignment with respect to the first layer of metallization.

An object of this invention is to overcome the alignment problem with the lower layer of metallization.

SUMMARY OF THE INVENTION

In accordance with this invention a device and a method of formation on a substrate of a semiconductor interconnection via structure for semiconductor devices, comprise:
a) forming a first metal layer on the substrate,
b) forming a first dielectric layer upon the first metal layer,
c) forming a mask upon the dielectric layer with a metal etching pattern therein,
d) etching through the first dielectric layer and the first metal layer to the substrate forming trenches between metal lines formed from the first metal layer covered with the dielectric layer,
e) forming a first etch stop layer upon the surface of the the first dielectric layer,
f) planarizing the etch stop layer,
g) forming of a second dielectric layer above the etch stop layer,
h) forming a second etch stop layer on the second dielectric layer,
i) patterning with a photolithographic mask through which the second dielectric and the second etch stop layer can be etched to form a via hole,
j) etching the via hole through the photolithographic mask down to a surface of the first metal layer, and
k) forming a second metal layer and a metal plug into the via hole extending into contact with the first metal layer.

Preferably, the first metal layer has a thickness within a range between about 1,000 Å and about 10,000 Å; the first dielectric layer comprises silicon dioxide ($SiO_2$) having a thickness within a range between about 1,000 Å and about 10,000 Å deposited by means of a low temperature CVD process.

In other aspects of the invention, the SRO is deposited by means of low pressure chemical vapor deposition; a second dielectric layer comprises silicon dioxide $SiO_2$ about with a thickness range between about 2,000 Å and about 6,000 Å is deposited upon first SRO layer by means of a low temperature CVD process; and the second etch stop layer comprises SRO.

Preferably, the thin film etch stop layer comprises SRO about with a thickness range between about 2,000 Å and about 6,000 Å is deposited upon the second dielectric layer by means of a low temperature oxide CVD process; and the second etch stop layer has a thickness of 500 Å.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
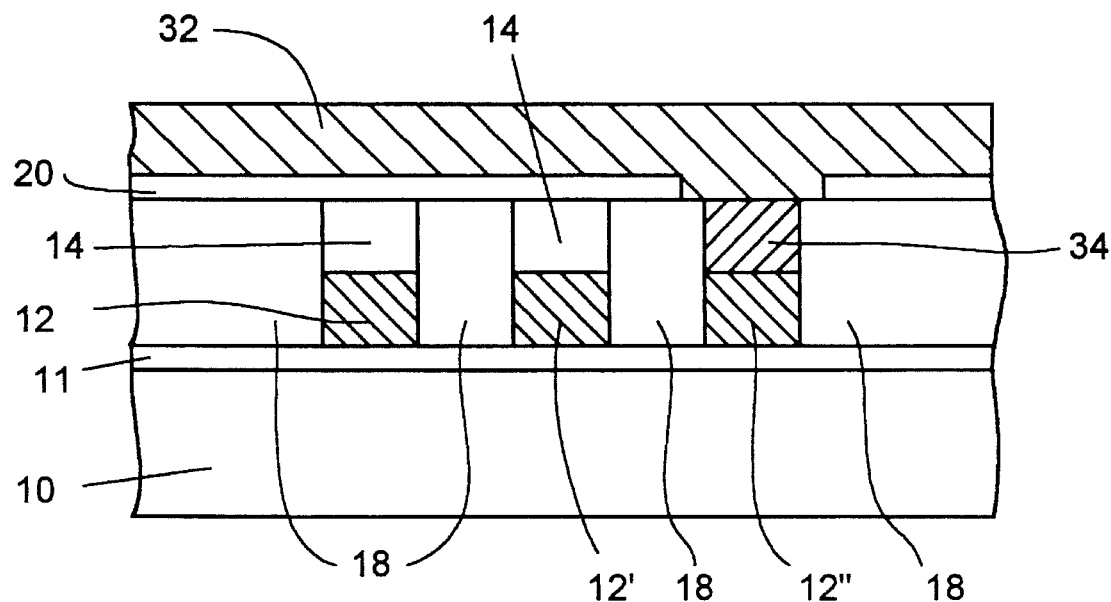
FIG. 1 shows an interconnection structure for semiconductor devices made in accordance with this invention.

FIG. 1 shows an interconnection structure for semiconductor devices made in accordance with this invention. The substrate 10 comprises silicon coated with a thin dielectric layer 11, such as silicon dioxide ($SiO_2$) upon which first metal lines 12, 12', 12" have been formed in a silicon rich oxide (SRO) layer 18. On top of two of the lines 12, 12', 12" is silicon dioxide ($SiO_2$) layer 14, except in the case of one line 12" upon which a metallic plug 34 has been formed. Between the lines 12, 12' and 12" and the $SiO_2$ structures 14 is SRO material 18. An $SiO_2$ layer 20 lies above the SRO material 18 and the lines 12, 12', 12", $SiO_2$ structures 14 and metallic plug 34. Atop the $SiO_2$ layer 20 lies a second metal (referred hereinafter to as metal 2) layer 32, which extends down through layer 20 into contact with metallic plug 34.

Figure 2:
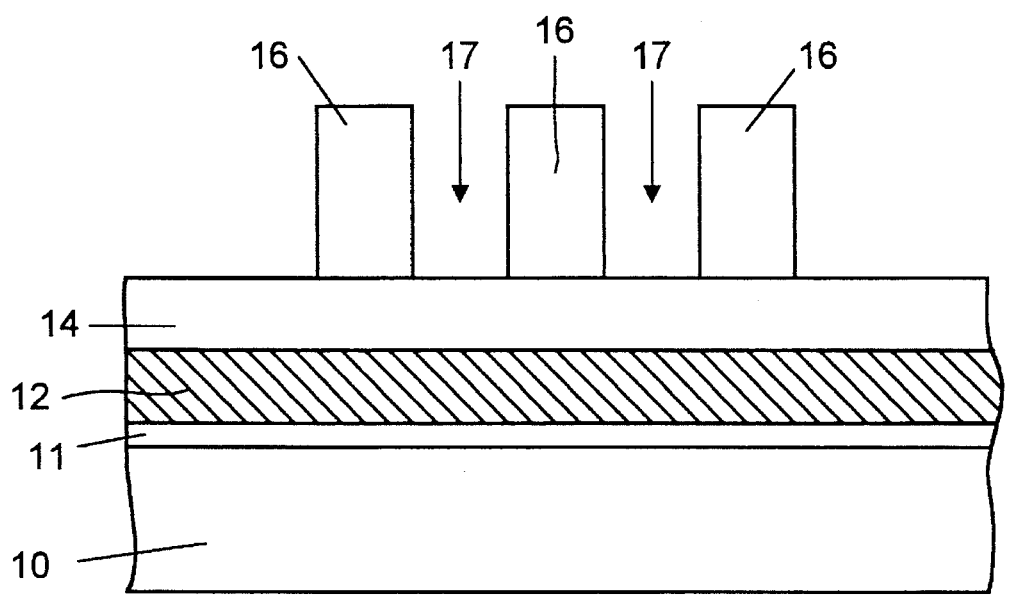
FIG. 2 shows the initial stages of fabrication of a device of the kind shown in FIG. 1.

FIG. 2 shows the initial stages of fabrication of a device of the kind shown in FIG. 1. Initially, the silicon substrate 10 coated with an insulator or dielectric layer 11 is coated with first metal (referred hereinafter as metal 1) layer 12. Layer 12 is about 5,000 Å thick within a thickness range between about 1,000 Å and about 10,000 Å. Upon metal 1 layer 12 is formed silicon dioxide ($SiO_2$) layer 14 preferably about 4,000 Å thick, having a thickness within a range between about 1,000 Å and about 10,000 Å. The $SiO_2$ is deposited by means of a low temperature CVD process. Upon the layer 14 is formed a photoresist layer 16 for use in photolithography. Photoresist 16 is formed into ribbed arrays 16 with trenches 17 therebetween. Then the layer 14 and layer 12 are dry etched by means of plasma using conventional plasma (dry) etching processes for metal 1 layer 12 and for SiO₂ layer 14.

Figure 3:
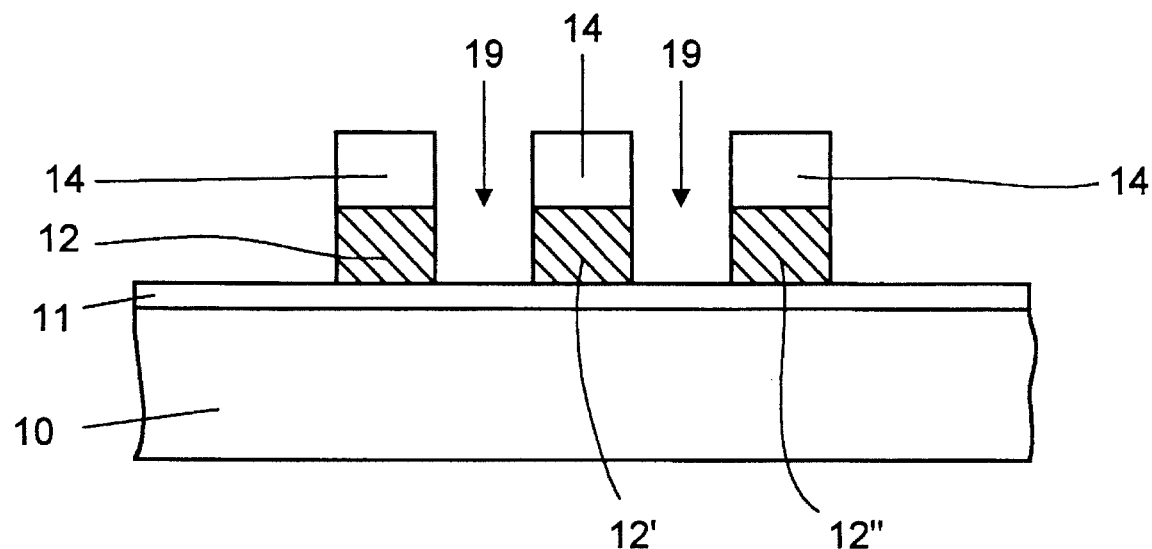
FIG. 3 shows the result of an etching process performed on the device as shown in FIG. 2.

The result of the etching process of FIG. 2 is shown in FIG. 3 with layer 10 carrying metal lines 12, 12' and 12" upon which silicon dioxide (SiO₂) lines 14 are formed. Between the lines are trenches 19.

Figure 4:
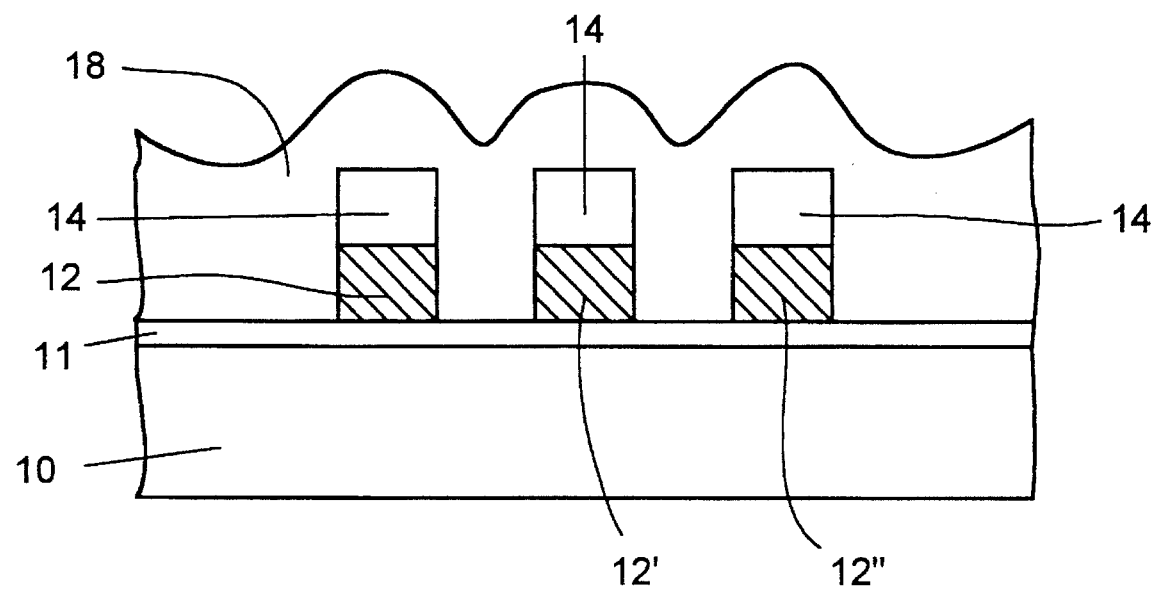
FIG. 4 shows the product of FIG. 3 upon which a SRO (Silicon Rich Oxide) layer has been deposited.

FIG. 4 shows the product of FIG. 3 upon which a first SRO (Silicon Rich Oxide) layer 18 has been deposited by means of a conventional Low Pressure Chemical Vapor Deposition (LPCVD) process.

Figure 5:
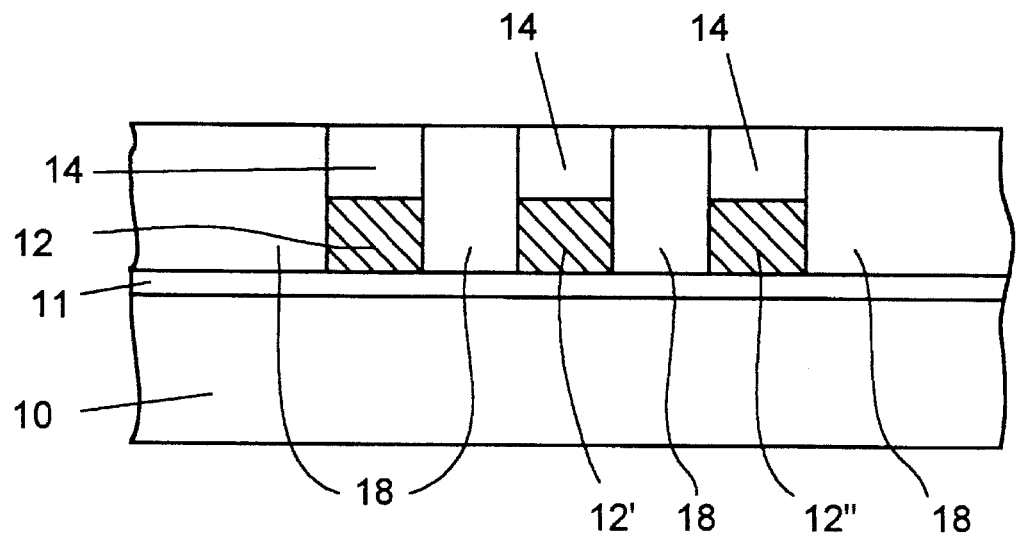
FIG. 5 shows the product of FIG. 4 after the SRO layer has been planarized.

FIG. 5 shows the product of FIG. 4 after the first SRO layer 18 has been planarized by means of conventional resist or SOG (Spin-On-Glass) etch back or by using CMP (Chemical Mechanical Polishing.)

Figure 6:
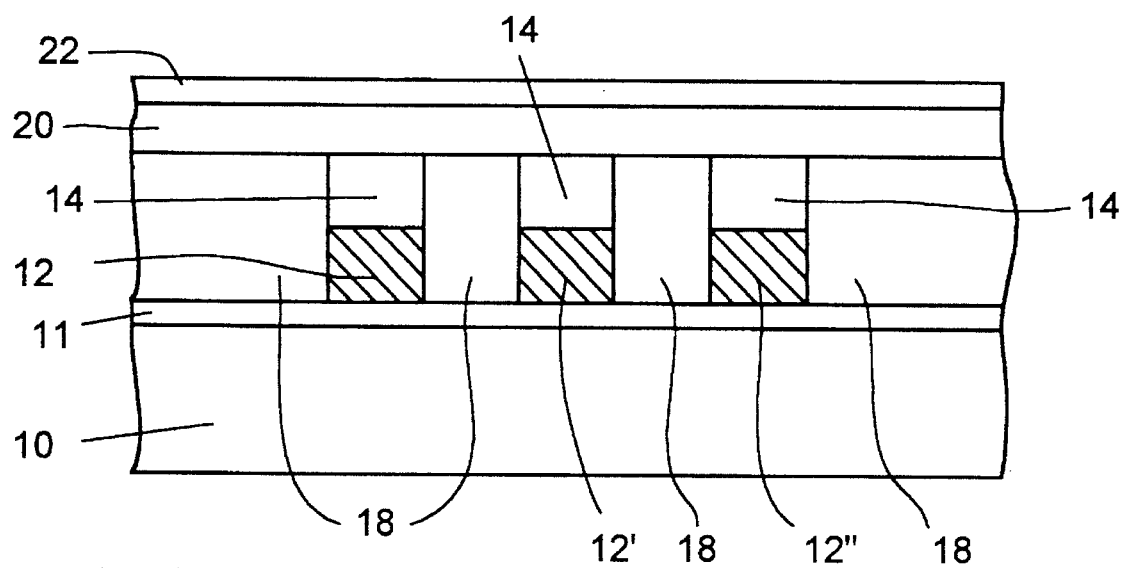
FIG. 6 shows the product of FIG. 5 after a layer of $SiO_2$ is formed.

FIG. 6 shows the product of FIG. 5 after a layer 20 of SiO₂ is formed preferably about 4,000 Å thick, having a thickness within the range between about 2,000 Å and about 6,000 Å upon first SRO layer 18. The SiO₂ layer 20 is deposited by means of LTO (Low Temperature Oxide) CVD process.

Upon SiO₂ layer 20 is deposited a second SRO a second etch stop layer 22 about 500 Å thick.

Figure 7A:
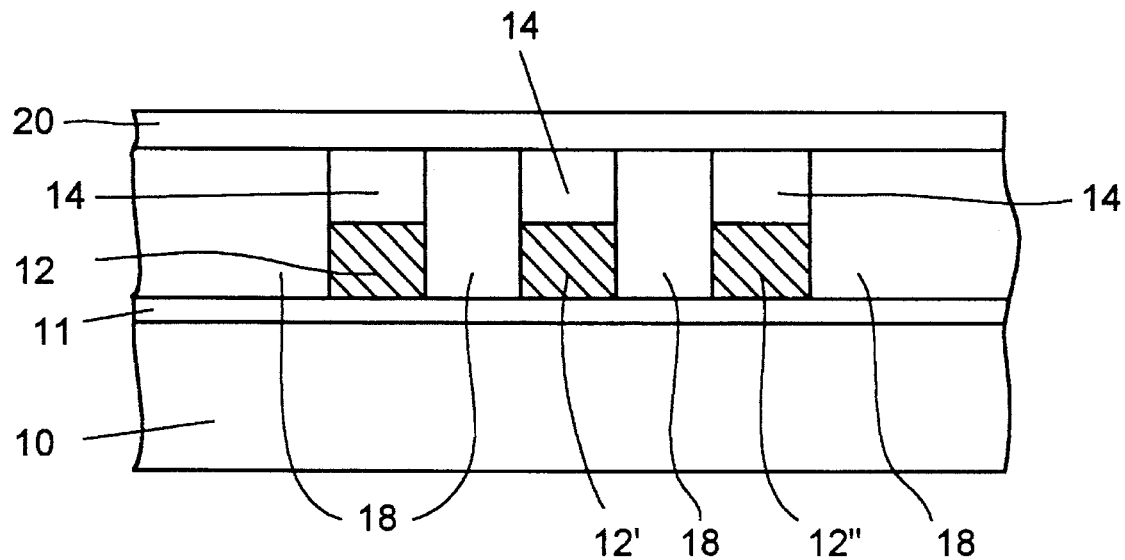
FIG. 7A shows a section taken along line A—A' in FIG. 9.
Figure 9:
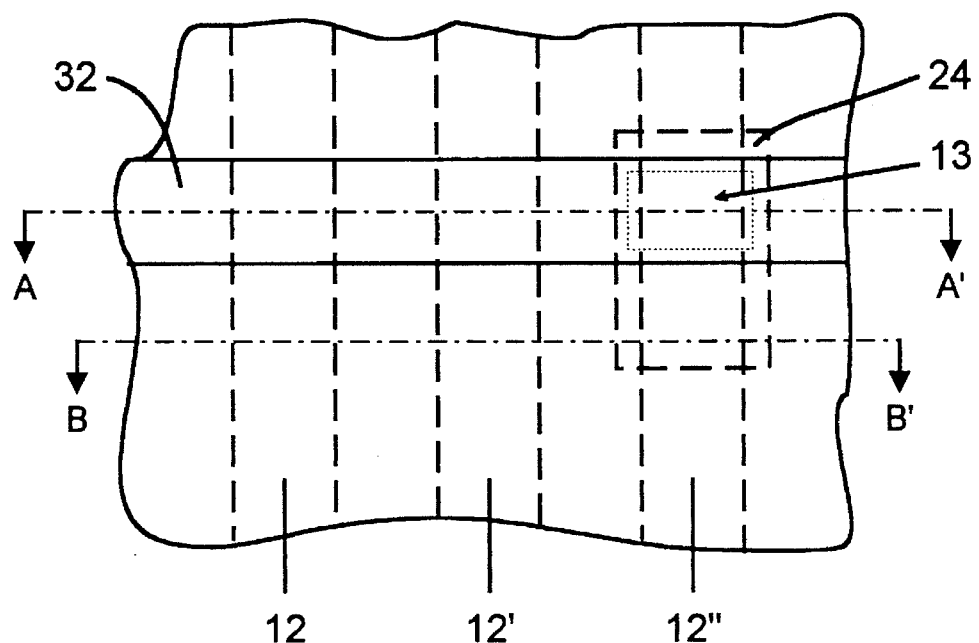
FIG. 9 is a plan view of the device of FIGS. 7A and 7B which shows the via added to the device.

Referring to FIG. 7A, which is a section taken along line A—A' in FIG. 9, the product of FIG. 6 has been patterned by a metal 2 photolithographic mask (not shown) through which the SiO₂ layer 20 and the second SRO layer 22 are etched to the point that only between about 500 Å and about 1000 Å SiO₂ layer 20 remains.

Figure 7B:
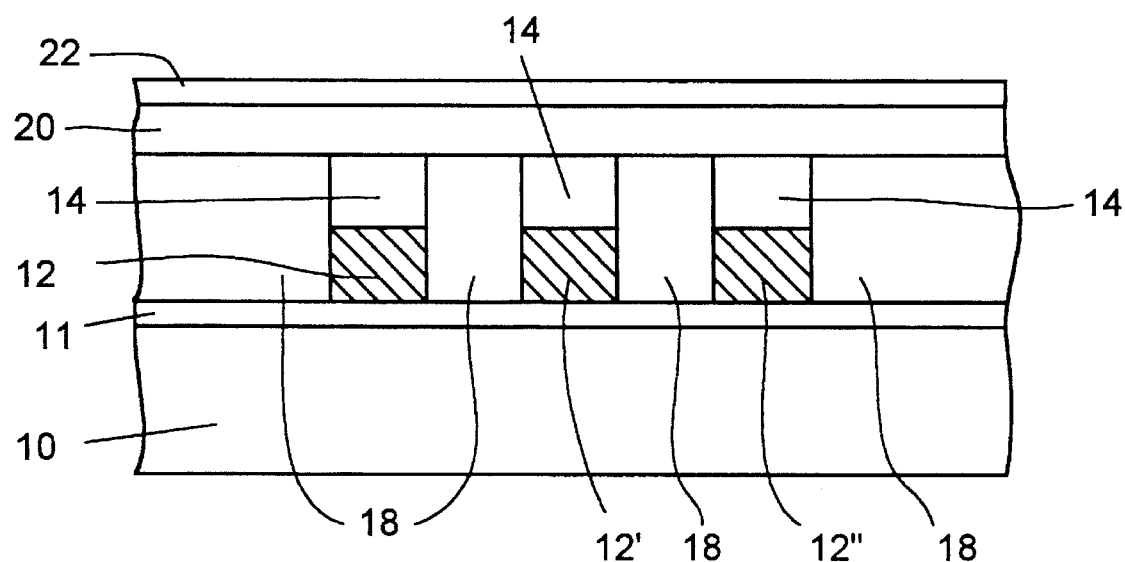
FIG. 7B shows a section taken along line B—B' in FIG. 9.

Referring to FIG. 7B, which is a section taken along line B—B' in FIG. 9, the product of FIG. 6 is protected from being patterned by a metal 2 photolithographic mask (not shown) so that the SiO₂ layer 20 and the second SRO layer 22 are not etched there.

Figure 8A:
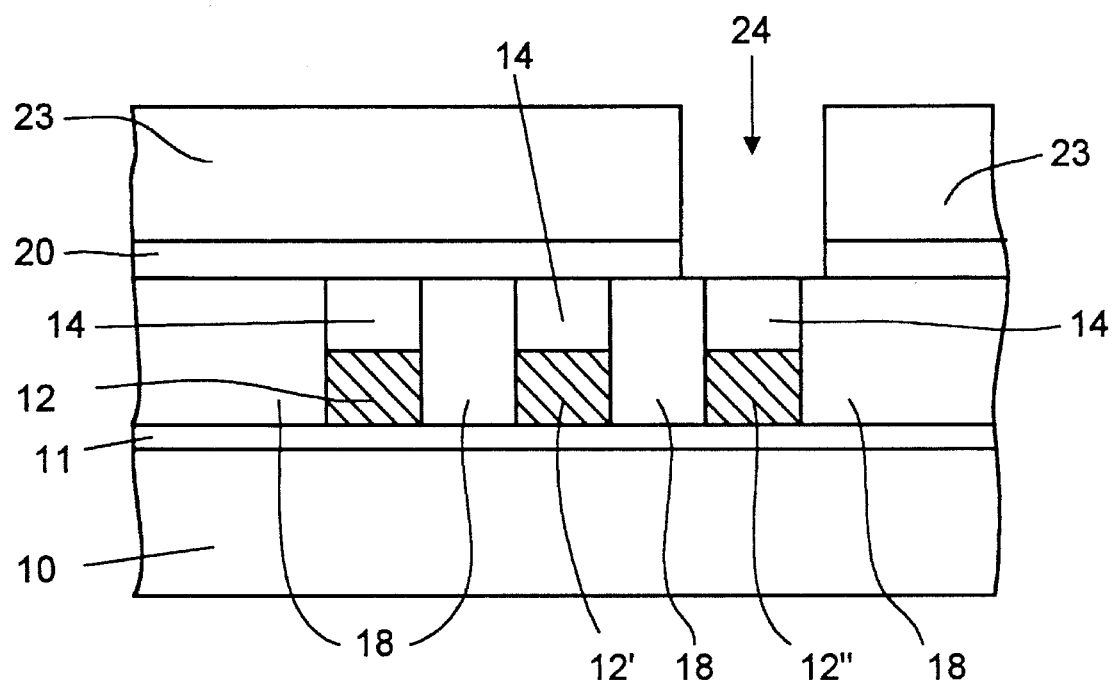
FIG. 8A shows the product of FIG. 7A after a layer of photoresist has been added above the $SiO_2$ layer with a via hole in the resist and the $SiO_2$ layer. A via etch of the $SiO_2$ layer is made using the SRO layer as an etch stop.

In FIG. 8A, taking the product of FIG. 7A, a layer of photoresist 23 has been added above SiO₂ layer 20. A via hole 24 has been made in the resist 23 and SiO₂ layer 20. A via etch of the SiO₂ layer 20 is made using the first SRO layer 18 as a first etch stop layer.

Figure 8B:
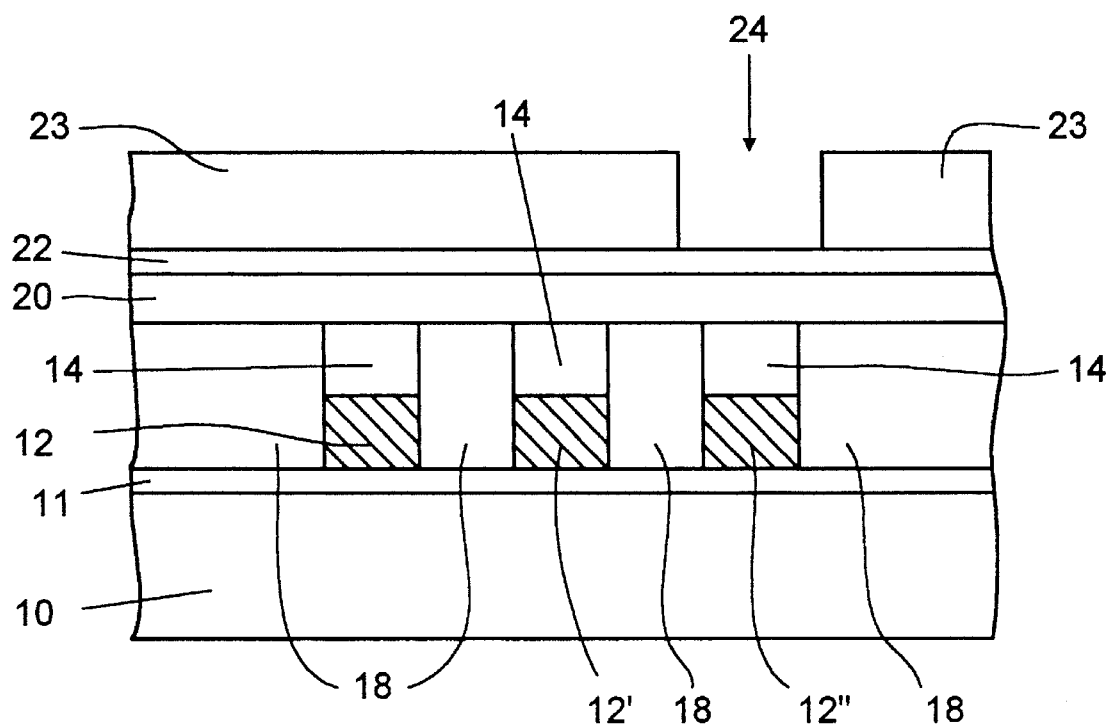
FIG. 8B shows the product of FIG. 7B after a layer of photoresist has been added above the $SiO_2$ layer as an etch stop. The via is not etched in this area and is self-aligned to a metal trench area.
Figure 10:
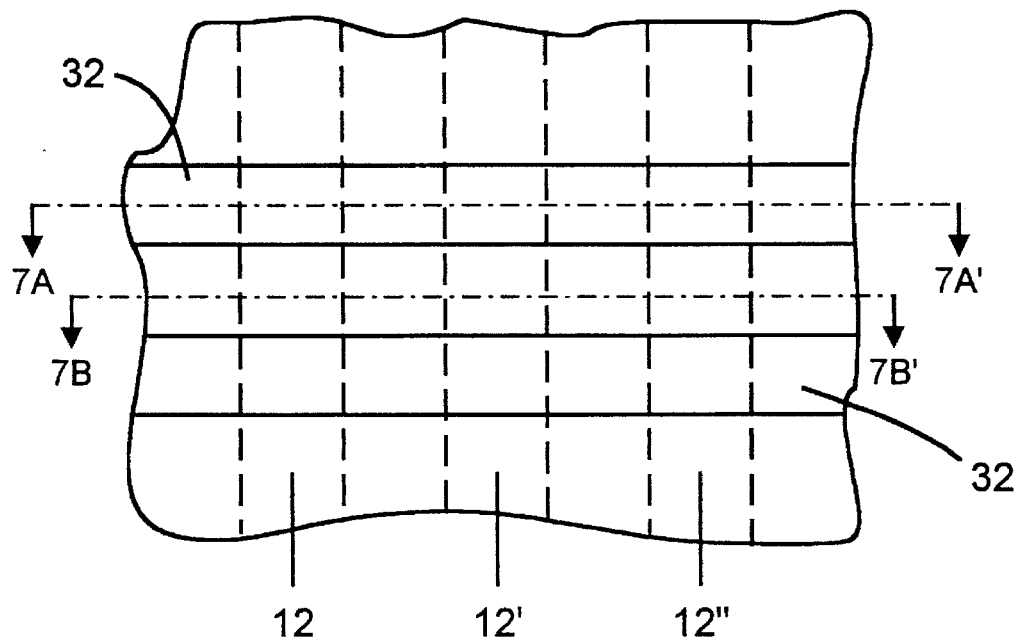
FIG. 10 is a plan view of the device of FIG. 7A, viewed from a different perspective.

In FIG. 8B, taking the product of FIG. 7B, a layer of photoresist 23 has been added above SiO₂ layer 20. The resist is exposed and developed forming mask opening 24 by conventional lithography. In this area, the second SRO layer 22 serves as an the second etch stop layer. The via is not etched in this area and is self-aligned to metal trench area as seen in FIG. 9, which is a plan view of the device of FIGS. 7A and 7B. The via is shown in FIG. 9 as region 13, which is defined by the overlapping area at the intersection of line 32 and via hole 24. Referring to FIG. 10, which is a plan view of the device of FIG. 7A, the pattern is seen from a different perspective. The difference between FIG. 9 and FIG. 10 is that FIG. 9 shows the via opening (hole) 24 and metal 2 line 32 filling in region 13, that is to say where metal 2 fills in through the metal 2 patterning mask into the trench region 24. A via etch of the SiO₂ layer 20 is stopped by the second SRO layer 22 serving as an etch stop.

After the process steps illustrated by FIGS. 8A and 8B, the final result of the process of this invention is shown in FIG. 1, in which the metal 2 layer 32 is deposited simultaneously as metal fills into the interconnection trenches and self-aligned via 13. The process of filling with metal 2 layer 32 can be performed by depositing the metal 2 layer 32 and etching back or CMP (Chemical Mechanical Polishing) of the metal 2 layer 32.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A semiconductor device having an interconnection structure comprising:

a first layer of a first dielectric material above a semiconductor substrate;

first metal lines on the first layer of the first dielectric material;

a second layer of a second dielectric material on the first layer of the first dielectric material between the first metal lines and covering at least portions of the first metal lines, the second layer of the second dielectric material having a surface above the first metal lines, the second dielectric material being different from the first dielectric material;

a first plurality of vias in the second layer of the second dielectric material extending from the surface of the second layer of the second dielectric material to surfaces of a first corresponding plurality of the first metal lines, the first plurality of vias filled with plugs formed from the first dielectric material;

a second plurality of vias in the second layer of the second dielectric material extending from the surface of the second layer of the second dielectric material to surfaces of a second corresponding plurality of the first metal lines, the second plurality of vias filled with metal plugs;

a third layer of the first dielectric material on the second layer of the second dielectric material and on the first plurality of vias; and second metal lines on the second layer of the second dielectric material and in contact with the metal plugs within the second plurality of vias.

2. The semiconductor device of claim 1, wherein the first dielectric material has different etch properties than the second dielectric material.

3. The semiconductor device of claim 1, wherein the first dielectric material is silicon dioxide and the second dielectric material is silicon rich oxide.

4. The semiconductor device of claim 1, wherein the surface of the second layer of the second dielectric material is planarized.

5. The semiconductor device of claim 4, wherein surfaces of the plugs formed from the first dielectric material and surfaces of the metal plugs are planar with the surface of the second layer of the second dielectric material.

6. A semiconductor device having an interconnection structure comprising:

a first layer of dielectric material above a semiconductor substrate;

first metal lines on the first layer of dielectric material;

a second layer of silicon rich oxide on the first layer of dielectric material between the first metal lines and covering at least portions of the first metal lines, the second layer of silicon rich oxide having a surface above the first metal lines;

a first plurality of vias in the second layer of silicon rich oxide extending from the surface of the second layer of silicon rich oxide to surfaces of a first corresponding plurality of the first metal lines, the first plurality of vias filled with plugs formed from a dielectric material;

a second plurality of vias in the second layer of silicon rich oxide extending from the surface of the second layer of silicon rich oxide to surfaces of a second corresponding plurality of the first metal lines, the second plurality of vias filled with metal plugs;

a third layer of dielectric material on the second layer of silicon rich oxide and on the first plurality of vias; and second metal lines on the second layer of silicon rich oxide and in contact with the metal plugs within the second plurality of vias.

* * * * *